United States Patent [19]

Setoguchi et al.

[11] Patent Number: 5,396,238
[45] Date of Patent: Mar. 7, 1995

[54] DATA COMPRESSING AND EXPANDING APPARATUS FOR TONE GENERATION

[75] Inventors: Masaru Setoguchi, Fussa; Takashi Akutsu, Akishima, both of Japan

[73] Assignee: Casio Computer Co., Ltd., Tokyo, Japan

[21] Appl. No.: 167,760

[22] Filed: Dec. 15, 1993

Related U.S. Application Data

[62] Division of Ser. No. 920,268, Jul. 27, 1992, Pat. No. 5,323,154.

[30] Foreign Application Priority Data

Aug. 8, 1991 [JP] Japan .................................. 3-199601

[51] Int. Cl.⁶ .............................................. H03M 7/30
[52] U.S. Cl. ......................................... 341/51; 84/600
[58] Field of Search .................... 341/51, 200, 143; 84/600, 601, 602, 603

[56] References Cited

U.S. PATENT DOCUMENTS

| | | | |
|---|---|---|---|
| 4,516,241 | 5/1985 | Farah et al. | 370/110.1 |
| 4,916,996 | 4/1990 | Suzuki et al. | |
| 5,128,963 | 7/1992 | Akgiri | 375/25 |
| 5,323,154 | 6/1994 | Setoguchi et al. | 341/50 |

FOREIGN PATENT DOCUMENTS

| | | |
|---|---|---|
| 62-30434 | 2/1987 | Japan . |
| 62-194742 | 8/1987 | Japan . |
| 62-194743 | 8/1987 | Japan . |
| 63-148716 | 6/1988 | Japan . |
| 63-172527 | 7/1988 | Japan . |

*Primary Examiner*—Brian K. Young
*Attorney, Agent, or Firm*—Frishauf, Holtz, Goodman & Woodward

[57] ABSTRACT

The lower significant n bits of a first differential value between adjacent sampled values of a sampled received signal are cut off to provide a second differential value, which is then subjected to adaptive quantization to thereby provide data compression. When this data is expanded, the second differential value decoded from the adaptive quantized value is sequentially accumulated by $2^n$ times at a period corresponding to $\frac{1}{2^n}$ of the sampling period of the received signal. As a result, a quantizing error (quantization noise) per sampling of the received signal is dispersed in $2^n$ periods to thereby provide an improved acoustic S/N ratio. When the first differential value of the received signal is quantized, when the lower significant n bits of the first differential value are cut off, and when the resulting signal is subjected to adaptive quantization, the resulting respective quantizing errors are fed to corresponding values processed next. Thus, accumulation of the quantizing errors is prevented.

2 Claims, 15 Drawing Sheets

FIG. 4

AMP [0], AMP [1],-----, AMP [SIZE-2], AMP[SIZE-1]

DATA [0], DATA [1], ---------------- DATA [SIZE-1]

FIG.12

| TABLE NO. M \ ADQV P | 0 | 1 | 2 | 3 | 4 | 5 | 6 | 7 |
|---|---|---|---|---|---|---|---|---|
| 0 | 00 | 01 | 02 | 03 | 04 | 05 | 06 | 07 |
| 1 | 00 | 01 | 02 | 03 | 05 | 06 | 07 | 08 |
| 2 | 00 | 01 | 03 | 04 | 06 | 07 | 09 | 0A |
| 3 | 00 | 02 | 04 | 06 | 07 | 09 | 0B | 0D |
| 4 | 00 | 02 | 05 | 07 | 0A | 0C | 0F | 11 |
| 5 | 00 | 03 | 06 | 09 | 0D | 10 | 13 | 16 |
| 6 | 00 | 04 | 08 | 0C | 10 | 14 | 18 | 1C |
| 7 | 00 | 05 | 0A | 0F | 14 | 19 | 1E | 23 |
| 8 | 00 | 06 | 0C | 12 | 19 | 1F | 25 | 2B |
| 9 | 00 | 07 | 0F | 16 | 1E | 25 | 2D | 34 |
| 10 | 00 | 09 | 12 | 1B | 23 | 2C | 35 | 3E |
| 11 | 00 | 0A | 15 | 1F | 2A | 34 | 3F | 49 |
| 12 | 00 | 0C | 18 | 24 | 31 | 3D | 49 | 55 |
| 13 | 00 | 0E | 1C | 2A | 38 | 46 | 54 | 62 |
| 14 | 00 | 10 | 20 | 30 | 40 | 50 | 60 | 70 |
| 15 | 00 | 12 | 24 | 36 | 49 | 5B | 6D | 7F |

FIG.13

| TABLE NO. M \ ADQV P | 0 | 1 | 2 | 3 | 4 | 5 | 6 | 7 |
|---|---|---|---|---|---|---|---|---|
| 0 | 0 0 | FF | FE | FD | FC | FB | FA | F9 |
| 1 | 0 0 | FF | FE | FD | FB | FA | F9 | F8 |
| 2 | 0 0 | FF | FD | FC | FA | F9 | F7 | F6 |
| 3 | 0 0 | FE | FC | FA | F9 | F7 | F5 | F3 |
| 4 | 0 0 | FE | FB | F9 | F6 | F4 | F1 | EF |
| 5 | 0 0 | FD | FA | F7 | F3 | F0 | ED | EA |
| 6 | 0 0 | FC | F8 | F4 | F0 | EC | E8 | E4 |
| 7 | 0 0 | FB | F6 | F1 | EC | E7 | E2 | DD |
| 8 | 0 0 | FA | F4 | EE | E7 | E1 | DB | D5 |
| 9 | 0 0 | F9 | F1 | EA | E2 | DB | D3 | CC |
| 10 | 0 0 | F7 | EE | E5 | DD | D4 | CB | C2 |
| 11 | 0 0 | F6 | EB | E1 | D6 | CC | C1 | B7 |
| 12 | 0 0 | F4 | E8 | DC | CF | C3 | B7 | AB |
| 13 | 0 0 | F2 | E4 | D6 | C8 | BA | AC | 9E |
| 14 | 0 0 | F0 | E0 | D0 | C0 | B0 | A0 | 90 |
| 15 | 0 0 | EE | DC | CA | B7 | A5 | 93 | 81 |

DATA COMPRESSING AND EXPANDING APPARATUS FOR TONE GENERATION

This is a division of application Ser. No. 07/920,268, filed Jul. 27, 1992, now U.S. Pat. No. 5,323,154.

BACKGROUND OF THE INVENTION

1. Field of the Invention

The present invention relates to data compressing and expanding apparatus which compress and expand a received signal with high efficiency.

2. Description of the Related Art

Conventionally, a differential pulse code modulation (DPCM) system and an adaptive differential pulse code modulation (ADPCM) system are proposed as a high efficiency coding system which saves the transmission capacity and reduces the capacity of a memory which records signals by compressing and expanding signal data.

With a regular ADPCM system, if the original signal is, for example, PCM data of 16 bits, the differential value between adjacent sampled values is obtained with an accuracy of 16 bits and quantized, for example, with 8 bits.

Thereafter, for example, as shown in FIG. 15, the 8-bit differential value is subjected to adaptive quantization with 4 bits containing, for example, a sign bit, by a conversion table having a quantizing step width corresponding to the differential value. FIG. 15 illustrates application of a table A to a small differential value and a table C to a larger differential value.

The differential value, thus subjected to adaptive quantization, is stored in a memory or sent to the receiving end through a transmission path.

While the above is the basic principles of the ADPCM encoding, decoding is performed in a process substantially reverse to the encoding to thereby reproduce the original signal.

In such a case, quantization of a 16-bit accuracy differential value with 8 bits naturally generates a new quantizing error involved in the 16-bit original data.

In order to reduce this error, if the 16-bit differential value is quantized, for example, with 10 bits which includes two additional bits, the resulting quantizing error is reduced, but the adaptive quantized value resulting from the conversion of the differential value by a table would increase in the number of bits, for example, from 4 bits used so far, to 5 or 6 bits, to thereby increase the transmission capacity and memory capacity, undesirably.

SUMMARY OF THE INVENTION

It is an object of the present invention to provide a data compressing and expanding apparatus which is capable of reducing a quantizing error compared to the conventional technique without increasing the number of bits of an adaptive quantized value.

According to one aspect of the present invention, there is provided a data compressing and expanding apparatus comprising:

differential value quantizing means for sequentially quantizing differential values each between adjacent sampled values of a received sampled value signal and sequentially adding quantizing errors each produced when a differential value is quantized to corresponding first differential values to be next quantized sequentially;

lower significant bit cutting off means for sequentially cutting off respective groups of lower significant n bits of the first differential values quantized by the differential value quantizing means when the respective first differential values are quantized with n being a natural number equal to or larger than 2 to obtain corresponding second differential values, and sequentially adding the respective groups of cut-off n bits to the corresponding first differential values to be processed next;

adaptive quantizing means for causing each of the obtained second differential values to be subjected to adaptive quantization to obtain an adaptive quantized value and adding a quantizing error produced in the adaptive quantization by decoding the adaptive quantized value to the corresponding second differential value to be next subjected to adaptive quantization; and differential value accumulating means for decoding the second differential values from the adaptive quantized value obtained from the adaptive quantizing means, and sequentially accumulating the decoded second differential value by $2^n$ times at a period equal to $\frac{1}{2^n}$ of the sampling period of the received signal and outputting the resulting signal.

According to this construction, since the quantizing error (or quantization noise) per sampling of a received signal is dispersed in $2^n$ periods, an improved acoustic S/N ratio is obtained compared to the case where the number of quantization bits is simply reduced by n bits.

When a first differential value is quantized from the received signal, and when the lower significant two bits of the first differential value are cut off, and is subjected to adaptive quantization by the adaptive quantizing means, the respective quantizing errors produced are fed to the corresponding values to be processed next, so that storage of the quantizing errors is prevented to thereby avoid the occurrence of a socalled offset drift.

As just described above, in terms of the received signal being subjected to compression by n-bit adaptive quantization, the present invention provides encoding with far reduced quantizing error (quantization noise) compared to the conventional techniques when the same storage capacity or transmission capacity is used.

Since the sampling frequency is increased to n times as high as the conventional one, so that aliasing noise which is generated around the sampling frequency during decoding can be filtered out by a filter of a simple circuit configuration.

It is another object of the present invention to provide a data compressing apparatus which is capable of encoding a received signal with the same quantity of data as the conventional one and with far reduced digitization error compared to the conventional technique.

According to another aspect of the present invention, there is provides a data compressing and expanding apparatus comprising:

differential value quantizing means for sequentially quantizing differential values between each adjacent sampled values of a received sampled value signal and sequentially adding quantizing errors produced when a differential value is quantized to corresponding first differential values to be next quantized sequentially;

lower significant bit cutting off means for sequentially cutting off respective groups of lower significant n bits of the first differential values quantized by said differential value quantizing means when the respective first differential values are quantized with n being a natural number equal to or larger than 2 to obtain corresponding second differential values, and sequentially adding the respective groups of cut-off n bits to the corresponding first differential values to be processed next; and adaptive quantizing means for causing each of the obtained second differential values to be subjected to adaptive quantization to obtain an adaptive quantized value and adding a quantizing error produced in the adaptive quantization by decoding the adaptive quantized value to the corresponding second differential value to be next subjected to adaptive quantization.

According to this construction, since the quantizing error (or quantization noise) per sampling of a received signal is dispersed in $2^n$ periods, an improved acoustic S/N ratio is obtained compared to the case where the number of quantization bits is simply reduced by n bits. Therefore, in terms of the received signal being subjected to compression by n-bit adaptive quantization, the present invention provides encoding with far reduced quantizing error (quantization noise) compared to the conventional techniques when the same storage capacity or transmission capacity is used.

It is an object of the present invention to provide an electronic musical instrument which is capable of compressing and storing data required for generation of a musical tone using an ADPCM system without increasing quantization noise.

According to a further aspect of the present invention, there is provided an electronic musical instrument comprising:

differential value quantizing means for sequentially quantizing differential values each between adjacent sampled values of a received sampled value signal and sequentially adding quantizing errors each produced when a differential value is quantized to corresponding first differential values to be next quantized sequentially;

lower significant bit cutting off means for sequentially cutting off respective groups of lower significant n bits of the first differential values quantized by the differential value quantizing means when the respective first differential values are quantized with n being a natural number equal to or larger than 2 to obtain corresponding second differential values, and sequentially adding respective groups of cut-off n bits to corresponding first differential values to be next processed sequentially;

adaptive quantizing means for causing each of the obtained second differential values to be subjected to adaptive quantization to obtain an adaptive quantized value and adding a quantizing error produced in the adaptive quantization by decoding the adaptive quantized value to the corresponding second differential value to be next subjected to adaptive quantization;

storage means for storing the adaptive quantized value obtained from said adaptive quantizing means;

a performance operator for designating the pitch of a tone to be generated; and tone signal generating means for sequentially reading out the adaptive quantized values stored in the Storing means on the basis of a frequency corresponding to the pitch designated by said performance operator, decoding the second differential value from the read-out adaptive quantized values, sequentially accumulating the decoded second differential values by $2^n$ times at a period corresponding to $\frac{1}{2^n}$ of the sampling period of the received signal, and outputting the resulting signal to generate a tone signal.

According to this construction, since the quantizing error (or quantization noise) per sampling of a received signal is dispersed in $2^n$ periods, an improved acoustic S/N ratio is obtained compared to the case where the number of quantization bits is simply reduced by n bits. Therefore, in terms of the received signal being subjected to compression by n-bit adaptive quantization, the present invention provides encoding with far reduced quantizing error (quantization noise) compared to the conventional techniques when the same storage capacity or transmission capacity is used.

Therefore, a more quantity of data can be stored in the same storage capacity than that in the conventional techniques. Thus, musical tones with more timbres and complicated human voice sounds can be produced as musical tones.

It is another object of the present invention to provide a data compressing and expanding method which is capable of reducing a quantizing error compared to the conventional technique without increasing the number of bits of an adaptive quantized value.

According to a further aspect of the present invention, there is provided a data compressing and expanding method comprising:

a differential value quantizing step of sequentially quantizing differential values each between adjacent sampled values of a received sampled value signal and sequentially adding quantizing errors each produced when a differential value is quantized to corresponding first differential values to be next quantized sequentially;

a lower significant bit cutting off step of sequentially cutting off groups of lower significant n bits of the first differential values quantized by said differential value quantizing step when the respective first differential values are quantized with n being a natural number equal to or larger than 2 to obtain corresponding second differential values, and sequentially adding the respective groups of cut-off n bits to differential values to be processed next;

an adaptive quantizing step of causing each of the obtained second differential values to be subjected to adaptive quantization to obtain an adaptive quantized value and adding a quantizing error produced in the adaptive quantization by decoding the adaptive quantized value to the second differential value to be next subjected to adaptive quantization; and a differential value accumulating step of decoding the second differential values from the adaptive quantized value obtained from said adaptive quantizing step, and sequentially accumulating the decoded second differential values by $2^n$ times at a period equal to $\frac{1}{2^n}$ of the sampling period of the received signal and outputting the resulting signal.

According to this method, since the quantizing error (or quantization noise) per sampling of a received signal is dispersed in $2^n$ periods, an improved acoustic S/N ratio is obtained compared to the case where the number of quantization bits is simply reduced by n bits.

When a first differential value is quantized from the received signal, and when the lower significant two bits of the first differential value are cut off, and is subjected to adaptive quantization by the adaptive quantizing means, the respective quantizing errors produced are fed to the corresponding values to be processed next, so that storage of the quantizing errors is prevented to thereby avoid the occurrence of a so-called offset drift.

As just described above, in terms of the received signal being subjected to compression by n-bit adaptive quantization, the present invention provides encoding with far reduced quantizing error (quantization noise) compared to the conventional techniques when the same storage capacity or transmission capacity is used.

It is an object of the present invention to provide a data compressing method which is capable of greatly reducing a quatization error involved in the received encoded signal compared to the conventional technique with the same quantity of data as in the conventional technique.

According to one aspect of the present invention, there is provided a data compressing method comprising:

a differential value quantizing step of sequentially quantizing differential values each between adjacent sampled values of a received sampled value signal and sequentially adding quantizing errors produced when a differential value is quantized to corresponding first differential values to be next quantized sequentially;

a lower significant bit cutting off step of cutting off respective groups of lower significant n bits of the first differential values quantized by the differential value quantizing step when the respective first differential values are quantized with n being a natural number equal to or larger than 2 to obtain corresponding second differential values, and sequentially adding the respective groups of cut-off n bits to first differential values to be processed next; and an adaptive quantizing step of causing each of the obtained second differential values to be subjected to adaptive quantization to obtain an adaptive quantized value and adding a quantizing error produced in the adaptive quantization by decoding the adaptive quantized value to the corresponding second differential value to be next subjected to adaptive quantization.

According to this method the quantizing error (or quantization noise) per sampling of a received signal is dispersed in $2^n$ periods, an improved acoustic S/N ratio is obtained compared to the case where the number of quantization bits is simply reduced by n bits.

It is an object of the present invention to provide a data compressing and expanding apparatus which is capable of greatly reducing an quantizing error compared to the conventional apparatus with the same quantity of data as in the conventional one.

According to a further aspect of the present invention, there is provided a data compressing and expanding apparatus comprising:

storage means for storing an adaptive quantized value obtained by the steps including a differential value quantizing step of sequentially quantizing differential values each between adjacent sampled values of a received sampled value signal and sequentially adding quantizing errors each produced when a differential value is quantized to corresponding first differential values to be next quantized sequentially; a lower significant bit cutting off step of sequentially cutting off groups of lower significant n bits of the first differential values quantized by the differential value quantizing step when the respective first differential values are quantized with n being a natural number equal to, or larger than 2 to obtain corresponding second differential values, and sequentially adding the respective groups of cut-off n bits to corresponding first differential values to be processed next; an adaptive quantizing step of causing each of the obtained second differential values to be subjected to adaptive quantization to obtain an adaptive quantized value and adding a quantizing error produced in the adaptive quantization by decoding the adaptive quantized value to the corresponding second differential value to be next subjected to adaptive quantization; and differential value accumulating means for decoding the second differential values from the adaptive quantized value stored in said storage means, and sequentially accumulating the decoded second differential value by $2^n$ times at a period equal to $\frac{1}{2^n}$ of the sampling period of the received signal and outputting the resulting signal.

According to this construction, since the quantizing error (or quantization noise) per sampling of a received signal is dispersed in $2^n$ periods, an improved acoustic S/N ratio is obtained compared to the case where the number of quantization bits is simply reduced by n bits. Therefore, in terms of the received signal being subjected to compression by n-bit adaptive quantization, the present invention provides encoding with far reduced quantizing error (quantization noise) compared to the conventional techniques when the same storage capacity or transmission capacity is used.

Therefore, a more quantity of data can be stored than that in the conventional technique with the same storage capacity.

It is a further object of the present invention to provide an electronic musical instrument which is capable of compressing and storing encoded data using an ADPCM system with the same quantity of encoded data as in the conventional techniques one and without increasing quantization noise compared to the conventional techniques.

According to a further aspect of the present invention, there is provided an electronic musical instrument comprising:

storage means for storing an adaptive quantized value obtained by the steps including differential value quantizing step of sequentially quantizing the differential value each between adjacent sampled values of a received sampled value signal and sequentially adding quantizing errors each produced when a differential value is quantized to corresponding first differential values to be next quantized sequentially; a lower significant bit cutting off step of sequentially cutting off groups of lower significant n bits of the first differential values quantized by said differential value quantizing step when the respective first differential values are quantized with n being a natural number equal to or larger than 2 to obtain corresponding second differential values, and sequentially adding the respective groups of cut-off n bits to corresponding first differential values to be processed next; adaptive quantizing step of causing each of the obtained second differential values to be subjected to adaptive quantization to obtain an adaptive quantized value and adding a quantizing error produced in the adaptive quantization by decoding the adaptive quantized value to the second differential value to be next subjected to adaptive quantization;

a performance operator for designating the pitch of a tone to be generated; and tone signal generating means for sequentially reading out the adaptive quantized values stored in the storing means on the basis of a frequency corresponding to the pitch designated by said performance operator, decoding the second differential value from the read-out adaptive quantized values, and sequentially accumulating the decoded second differential values by $2^n$ times at a period corresponding to $\frac{1}{2^n}$ of the sampling period of the received signal, and outputting the resulting signal to generate a tone signal.

According to this construction, since the quantizing error (or quantization noise) per sampling of a received signal is dispersed in $2^n$ periods, an improved acoustic S/N ratio is obtained compared to the case where the number of quantization bits is simply reduced by n bits.

Since the adaptive quantized value is stored beforehand, the arrangement for compression of data is simple as well as allows a more quantity of data to be stored than that in the conventional technique with the same storage capacity as the conventional one to thereby generate musical tones with many timbers and complicated human voice sounds as musical sounds compared to the conventional techniques.

It is a further object of the present invention to provide a data compressing and expanding method which is capable of greatly reducing a quantizing error involved in a received encoded signal with the same quantity of data as that in the conventional techniques.

According to an aspect of the present invention, there is provided a data compressing and expanding method comprising:

a differential value quantizing step of sequentially quantizing differential values each between adjacent sampled values of a received sampled value signal and sequentially adding quantizing errors each produced when a differential value is quantized to corresponding first differential values to be next quantized sequentially;

a lower significant bit cutting off step of sequentially cutting off groups of lower significant n bits of the first differential values quantized by the differential value quantizing step when the respective first differential values are quantized with n being a natural number equal to or larger than 2 to obtain corresponding second differential values, and sequentially adding the groups of cut-off n bits to the corresponding first differential value to be processed next;

an adaptive quantizing step of causing each of the obtained second differential values to be subjected to adaptive quantization to obtain an adaptive quantized value and adding a quantizing error produced in the adaptive quantization by decoding the adaptive quantized value to the corresponding second differential value to be next subjected to adaptive quantization;

a storing step of storing the adaptive quantized value obtained by said adaptive quantized step; and a differential value accumulating step of decoding the second differential values from the adaptive quantized value stored at said storing step, and sequentially accumulating the decoded second differential values by $2^n$ times at a period corresponding to $\frac{1}{2^n}$ of the sampling period of the received signal, and outputting the resulting signal.

According to this method, since the quantizing error (or quantization noise) per sampling of a received signal is dispersed in $2^n$ periods, an improved acoustic S/N ratio is obtained compared to the case where the number of quantization bits is simply reduced by n bits.

When a first differential value is quantized from the received signal, and when the lower significant two bits of the first differential value are cut off, and is subjected to adaptive quantization by the adaptive quantizing step, the respective quantizing errors produced are fed to the corresponding values to be processed next, so that storage of the quantizing errors is prevented to thereby avoid the occurrence of a so-called offset drift.

As just described above, in terms of the received signal being subjected to compression by n-bit adaptive quantization the present invention provides encoding with far reduced quantizing error (quantization noise) compared to the conventional techniques when the same storage capacity or transmission capacity is used.

BRIEF DESCRIPTION OF THE DRAWINGS

These and other objects and features of the present invention will be easily understood by those skilled in the art from the description of preferred embodiments of the present invention, when taken in conjunction with the accompanying drawings.

In the drawings:

FIG. 4 shows the relationship between PCM tone data AMP [I] and quantized differential value DATA [I];

FIG. 12 shows an ADPCM conversion table (for positive sign);

FIG. 13 shows an ADPCM conversion table (for negative sign);

DETAILED DESCRIPTION OF THE PREFERRED EMBODIMENT

In the present embodiment, the use of adaptive differential PCM (ADPCM) is premised. For example, a differential value of PCM data which is a tone signal sampled with 16 bits is quantized, and converted to an adaptive quantized value by a quantization table updated in accordance with the differential value, and the adaptive quantized value is stored in a memory. Thereafter, when a performer plays an electronic musical instrument, the tone signal is decoded in a process substantially reverse to the adaptive quantization and is sounded.

<Operational Principles>

Figure 1:
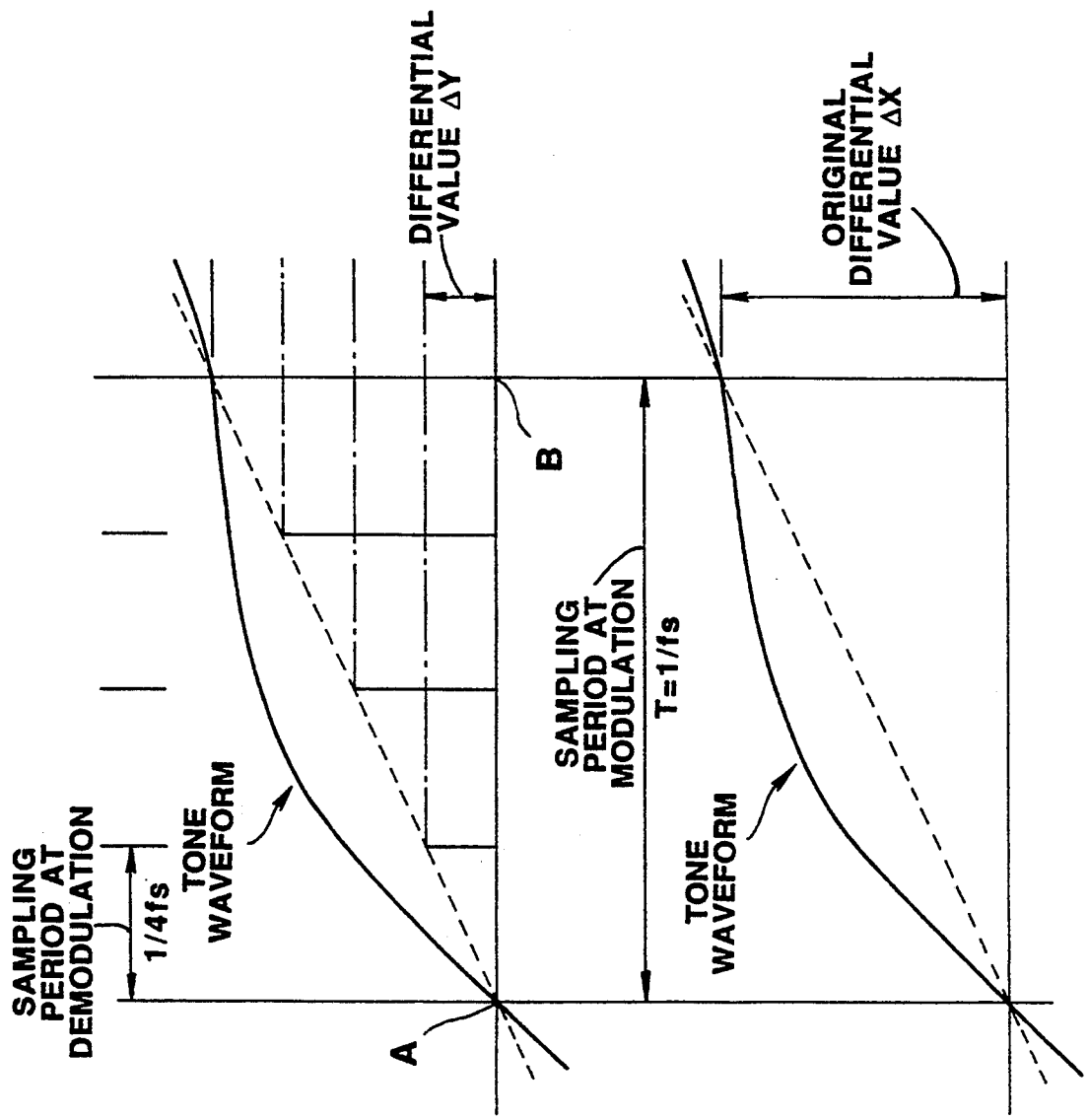
FIGS. 1a and 1b illustrate the principles of the present invention.

First, the operational principles of this embodiment will be described with reference to FIG. 1.

FIG. 1(b) shows the differential value Δx between PCM data value at sampling points B and A of a musical tone waveform sampled at a sample period T=1/fs (fs: sampling frequency). The original PCM data is composed, for example, of 16-bit data and the differential value Δx is also composed of 16 bits, originally.

Conventionally the Δx is further requantized with 8 bits and then also is subjected to adaptive quantization with 4 bits. In contrast, it is a main object of this embodiment to quantize the differential Δx with an accuracy of about 10 bits without increasing the number of bits of the adaptive quantized value.

After the differential value Δx is quantized with 10 bits which is 2 bits more than those in the conventional one, shifted by 2 bits rightward and the lower significant two bits are cut off. As a result, as shown in FIG. 1(a), a differential value Δy of 8 bits is obtained having an amplitude corresponding to ¼ of the differential value Δx.

While as just described above, 8-bit data is obtained by the cutting off of 2 bits of the differential value, the resulting differential value is basically different in quantization accuracy from the conventional one which is quantized with 8 bits from the beginning. More particularly, when the lower significant two bits are cut off, the number of quantizing steps is ¼ of that with 10 bits while the amplitude range (dynamic range) of the differential value Δy also becomes ¼ simultaneously. Therefore, the step width of quantization is the same as with 10 bits. Thus, the accuracy of quantization is maintained.

The differential value Δy obtained by the cutting off of the lower significant two bits is then converted to a 4-bit adaptive quantized value in accordance with an ADPCM conversion table and is stored in a memory.

In reproduction, the differential value is decoded from the adaptive quantized value read out of the memory and then sequentially accumulated at a period corresponding to ¼ of the original PC sampling period T as shown in FIG. 1(a). As a result, a waveform shown by the dotted line is produced in contrast to the musical tone waveform between sampling points A and B of FIG. 1(a).

In this way, the quantizing error involved in the differential value quantized with 10 bits and from which the lower significant two bits are cut off are dispersed four times at a timing of ¼ of the sampling period T.

As a result, in comparison to quantization with 10 bits, the deterioration in the acoustic dynamic range (or S/N ratio) is 2 bits or $2^2 = 4$ times = 12 dB (decibel) in the ordinary 8-bit quantization while the deterioration is only ¼ of 2 bits = 0.5 bits or $2^{\frac{1}{2}}$ times = 3 dB, so that the dynamic range is improved by 9 dB compared to the ordinary 8-bit quantization. Since the differential value is quantized with 10 bits which are 2 bits more than in the conventional technique, and then the lower significant 2 bits are cut off, the number of bits of the adaptive quantized value does not increase and requires only 4 bits which is the same as in the conventional technique. The description of the operative principles of the present invention is now closed.

In decoding, unnecessary frequency spectra determined by the frequency spectrum contained in the original signal at sampling are produced before and after the sampling frequency. As just described, if the sampling frequency is increased to four times the original PCM sampling frequency, the highest frequency of the original signal and the sampling frequency becomes so distant from the each other that the circuit configuration of the low pass filter which filters out the unnecessary frequency spectra is simplified.

<Structure>

The overall structure of this embodiment will be described below.

Figure 2:
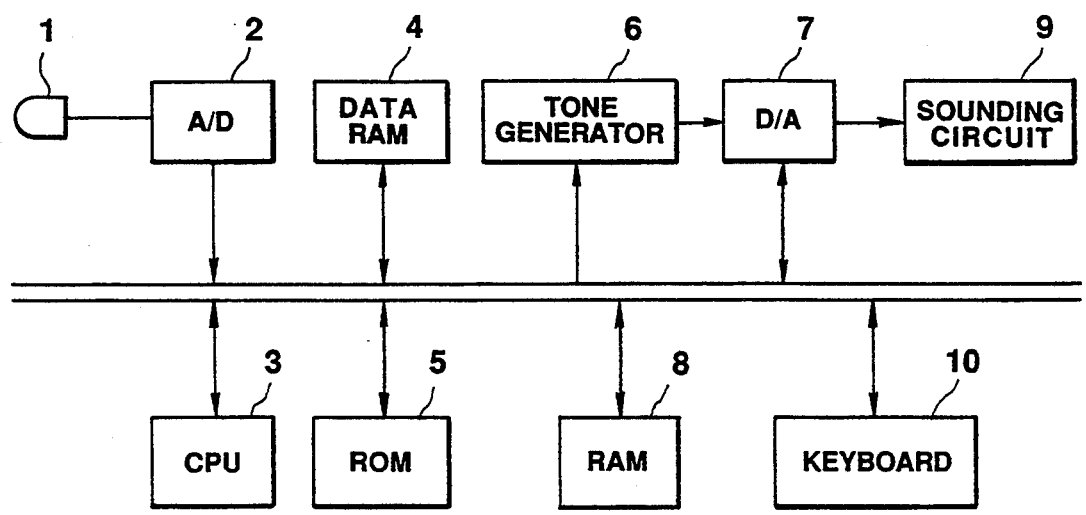
FIG. 2 is the overall schematic of an embodiment of the present invention.

FIG. 2 is the overall schematic of an embodiment of an electronic keyboard musical instrument to which the inventive data compressing and expanding circuit is applied.

In FIG. 2, the user himself can create tone data used in his performance. A tone with a constant pitch obtained from the performed musical instrument is detected by a sound detector 1 such as a microphone to thereby provide a tone signal. Thereafter, the musical tone signal is converted to a digital signal by an A/D (analog-to-digital) converter 2.

A CPU (central processing unit) 3 executes a program stored in a ROM (read only memory) 5 using a RAM (random access memory) 8 as a work memory to compress the data on the tone signal in accordance with an ADPCM system, as mentioned above, and then stores the resulting data as tone data in a data RAM 4.

Thereafter, when a performer plays music at keyboard 10, a tone generator 6 reads out and decodes tone data from data RAM 4 in accordance with the ADPCM system and generates a tone signal on the basis of the played data from keyboard 10. The tone signal is output to a sounding circuit 9 through a D/A (digital-to-analogue) converter 7.

<Operation>

A series of operations of the present embodiment will be described below with reference to the operation flowcharts of FIGS. 3–11. These operations are realized as CPU 3 of FIG. 2 executes a control program stored in ROM 5.

At the beginning, the overall operation of generating data will be described with respect to the operation flowchart of FIG. 3.

First, 16-bit PCM data is read into CPU 3 (step S301). Differential data is produced (step S302). The differential data is bit shifted rightward to thereby to cut off 2 bits (step S303). Thereafter, an adaptive quantization table is accessed with the differential value so as to cause the differential value to be subjected to adaptive modulation (step S304). The resulting adaptive quantized value is written into data RAM 4 (step S305).

The generation of the differential value data at step S302 of FIG. 3 will be described with reference to the FIG. 5 operation flowchart.

First, AMP [I] is an array variable secured in RAM 8. This array holds a total of SIZE complement binary PCM tone data of 16 bits, AMP [0] to AMP [SIZE—1], where a variables I changes from 0 to [variable SIZE-]—1. This is the PCM data obtained by source file reading at step S301 of FIG. 3.

Figure 5:
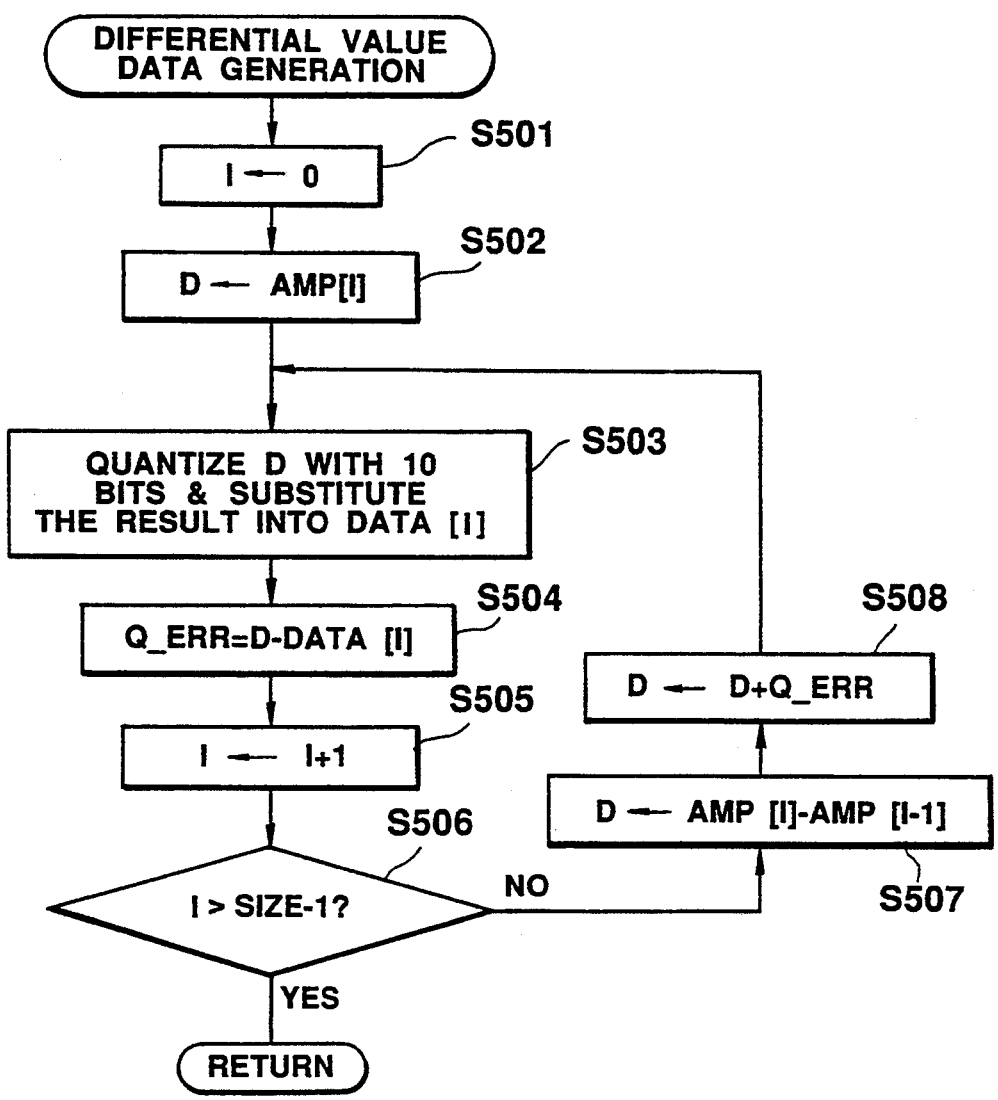
FIG. 5 is an operation flowchart indicative of the generation of differential value data.

In FIG. 5, first, a value "0" is substituted into variable I and initialization is performed (step S501).

Thereafter, since no differential value exists at the beginning, the original 16-bit PCM data expressed by AMP [0] is handled as an initial differential value and written into a variable D in RAM 8 (step S502).

Subsequently, the loop process of steps S503–S506 to S507–S503 is iterated to thereby produce a differential value D sequentially.

First, a 16-bit differential value D is quantized with 10 bits and the result is written into an array, for example, of DATA [I] on RAM 8 (step S503). As shown in FIG. 4, AMP [0] corresponds to DATA [0]; DATA [1] to AMP [1]-AMP [0]; and DATA [SIZE—1] to AMP [SIZE—1] —AMP [SIZE —2].

The quantizing error is the difference between the 16-bit differential value D and the differential value DATA [I] quantized with 10 bits at step S503 and is substituted into variable Q_ERR in RAM 8 (step S504).

Thereafter, I is incremented (step S505) and it is checked whether I is larger than SIZE—1. If not, a differential value indicative of the current PCM tone data minus the last PCM tone data is substituted into variable D (step S507). An error Q_ERR involved in the last differential value is added to the differential value D to provide a new differential value D (step S508).

The sum of the error Q_ERR and the differential value D (with an accuracy of 16 bits) is then quantized with 10 bits at step S503 and the resulting value is substituted into an array of DATA [I] (step S503).

As just described above, error Q_ERR is sequentially with an accuracy of 16 bits fed and added to the next differential value, and the resulting value is quantized with 10 bits, so that no error involved in the differential value is accumulated.

When the variable I exceeds SIZE —1, the generation of the differential value is terminated (step S506).

In this way, the differential values are obtained for array DATA [0] to DATA [SIZE —1].

Figure 6:
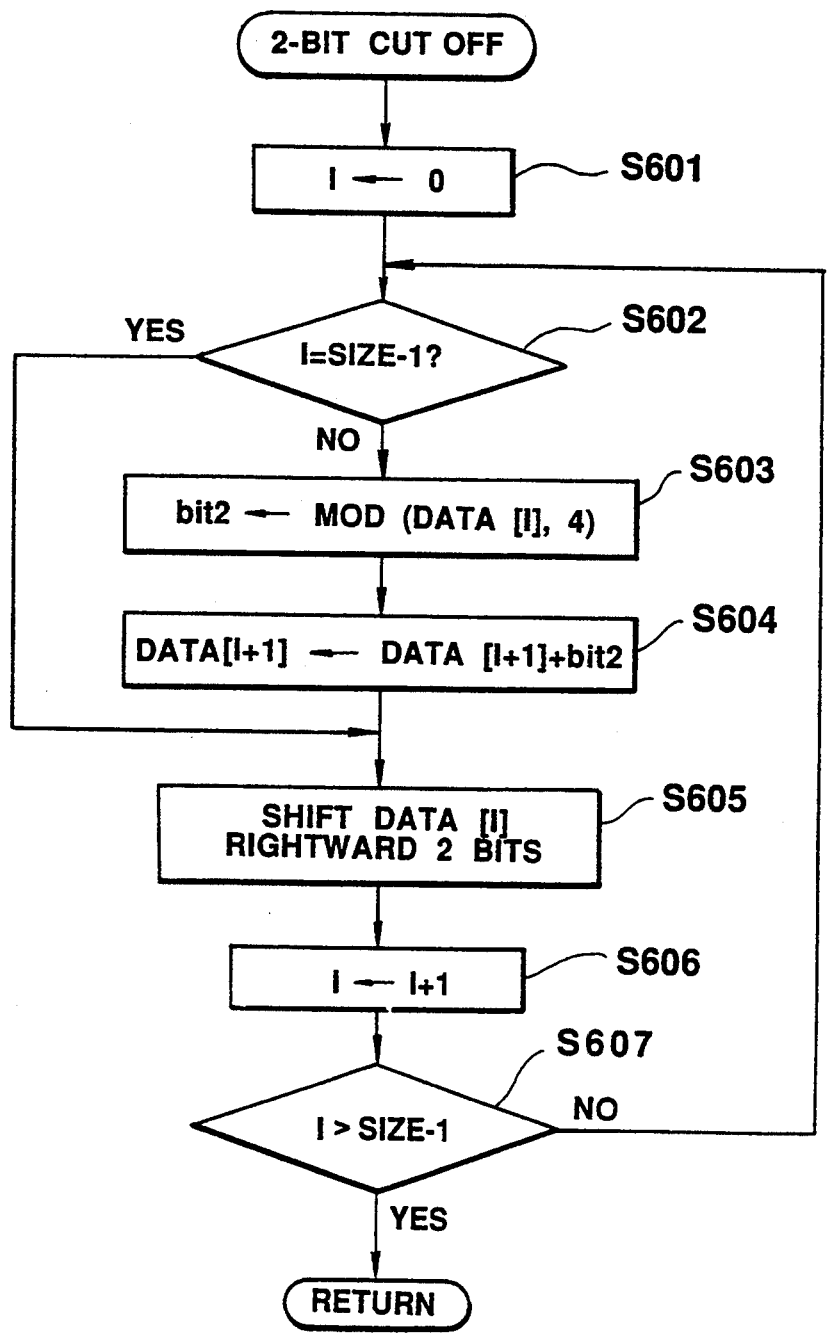
FIG. 6 is an operation flowchart indicative of cutting off of 2 bits from the differential value data.
Figure 7:
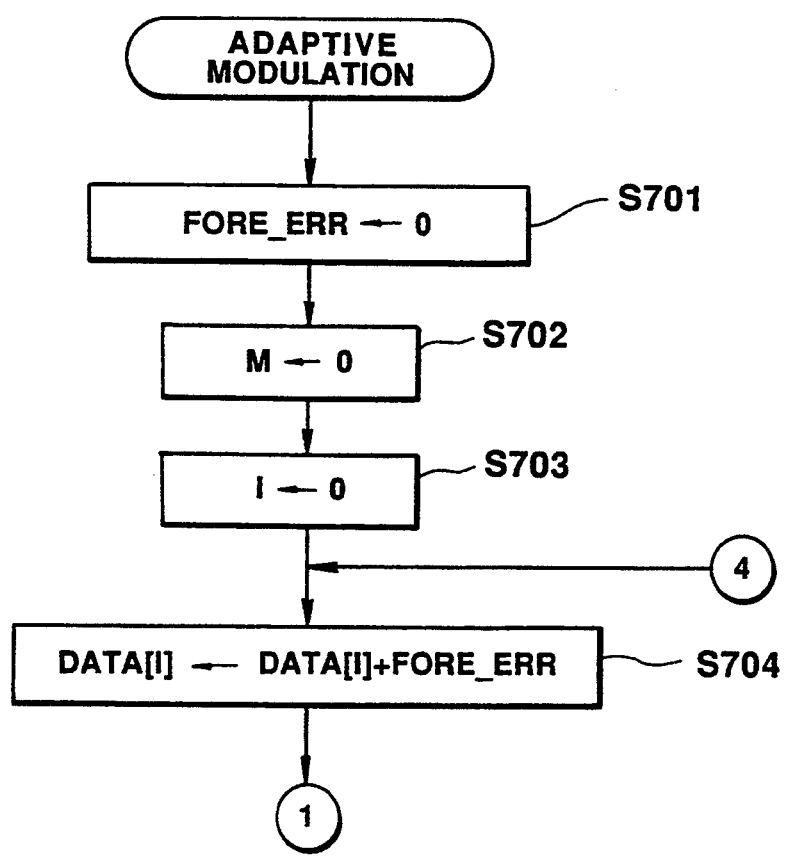
FIG. 7 is an operation flowchart (part 1) indicative of adaptive modulation.

Cutting off two bits at step S303 of FIG. 3 will be described with reference to the FIG. 6 operation flowchart.

A pointer I which points to array DATA [I] in which the differential value on RAM 8 exists is set to 0 (step S601).

It is then determined whether pointer I has reached SIZE—1 (step S602). Since this determination is initially performed, it is NO and control passes to step S603.

The value of the two bits to be cut off is calculated. To this end, a remainder is calculated by dividing the current differential value DATA [I] by a factor of 4 and is then substituted into variable bit 2 on RAM 8 (step S603). Bit 2 is equal to the lower significant 2 bits of DATA [I]. The data is obtained, for example, in the form of a 16-bit compliment. Therefore, variable bit 2 can express positiveness or negativeness which correspond to the positiveness or negativeness of the original differential value DATA [I], respectively.

Thereafter, variable bit 2 is added to the contents of the next differential value DATA [I+1] to provide new DATA [I+1] (step S604). That is, when a differential value with an accuracy of 10 bits is cut off by 2 bits, the value of a bit 2 which is an error involved in the differential value for cut-away 2 bits is fed and added to the next differential value DATA [I +1].

Thereafter, the current differential value DATA [I] is shifted rightward by 2 bits and 2 bits are cut off (step S605). At this time, if DATA [I] is positive (the most significant bit MSB=0), "0's" are filled into MSB and MSB—1 which are emptied by the rightward 2-bit shifting. If DATA [I] is negative (MSB=1), "1's" are filled into MSB and MSB —1 which are emptied by the rightward 2-bit shifting. In this processing, the differential value Δy (see FIG. 1(b)) with a dynamic range which is ¼ of the dynamic range of the original differential value Δx is obtained. This differential value is sequentially accumulated four times at a timing of ¼ of the original sampling period into the reproduction to be described later in more detail.

The variable I is then incremented (step S606). Then it is determined whether the variable I is larger than SIZE —1 (step S607). Until the determination becomes YES, control returns to step S602 to iterate the above operation.

When the variable I becomes equal to SIZE —1 at step S602, control passes to step S605 to only cut off 2 bits since there are no differential values any longer after the final differential value.

Figure 3:
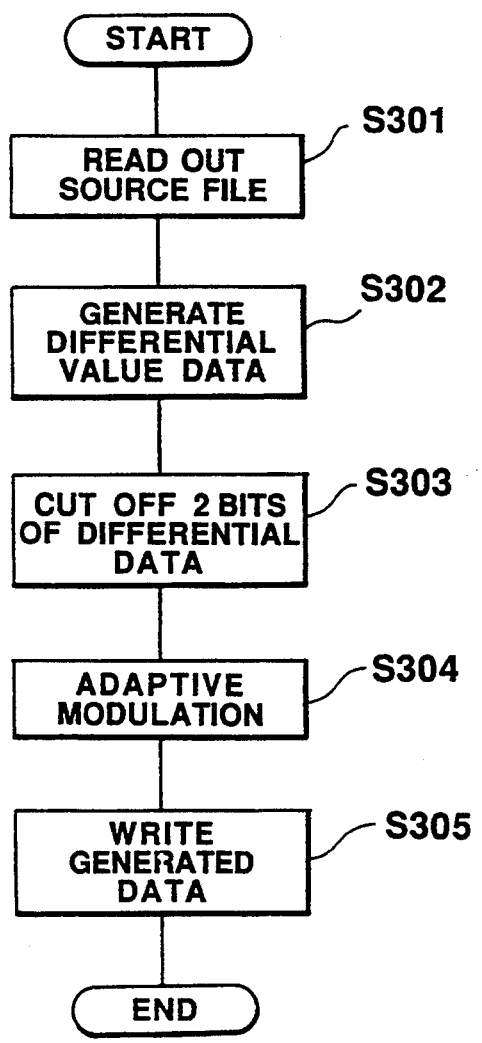
FIG. 3 is an operation flowchart indicative of a process for data recording in the embodiment.

Thereafter, when the determination becomes YES at step S607 through step S606, processing at step S303 of FIG. 3 is terminated.

In this way, the contents of array DATA [I] ($0 \leq I \leq$ (SIZE —1)) in which a respective original differential value with an accuracy of 16 bits is stored are rewritten with the corresponding value free from the lower significant 2 bits. As a result, all the differential values DATA [I] having an accuracy of 10 bits so far are rewritten with an accuracy of 8 bits.

Since the lower significant 2 bits of the 10-bit differential value are sequentially added to the next differential values at a timing of the sampling clock, quantizing errors involved in the 2-bit cut-off operation are not accumulated.

As described above, the differential value from which 2 bits are cut off is subjected to adaptive modulation at step S304 of FIG. 3 as follows.

Before the adaptive modulation is described, a conversion table for adaptive quantization in the ADPCM system will be described.

FIGS. 12 and 13 show a conversion table in which a differential value is quantized with a quantizing step width suitable for the differential value. There are tables for positive and negative numerals which are respectively selected depending on the positiveness and negativeness of the received differential value.

In FIGS. 12 and 13, a table number M shows a conversion table number selected in accordance with the magnitude of a received differential value. The uppermost columns relate to an adaptive quantized value (ADQV) P. Each table is allocated 8 differential values which are converted to adaptive quantized values P and with a variable quantizing step width.

Figure 15:
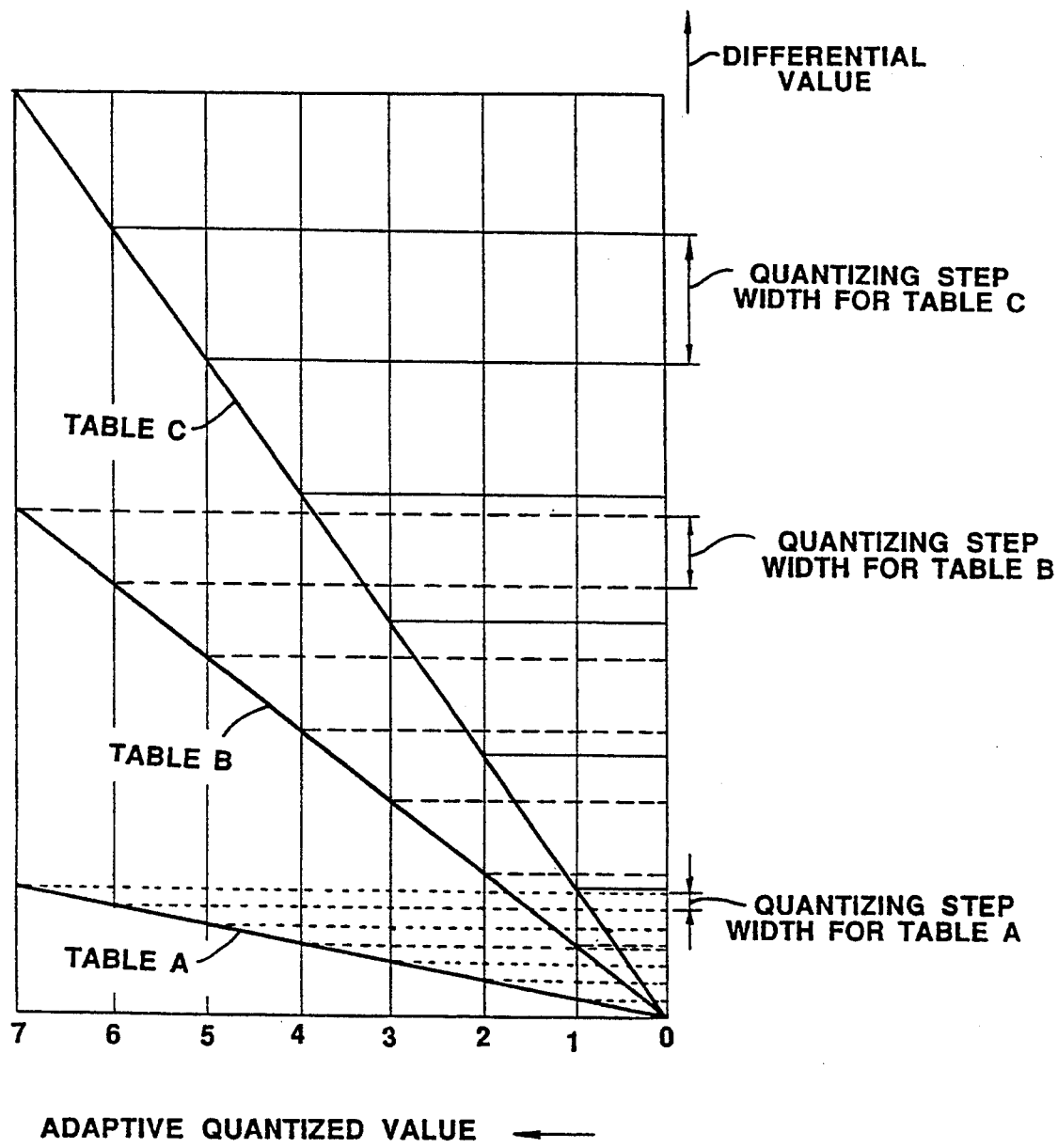
FIG. 15 illustrates an adaptive quantization conversion table.

In this case, as shown in FIG. 15, a received larger differential value is converted to an adaptive quantized value by a table having a larger quantizing step width (a larger table number M).

A specified adaptive modulation will be described with reference to FIGS. 7-10.

First, variable FORE_ERR on RAM 8 which stores a value added as an error value to the next data is initialized to 0 (step S701). Pointer M which points out the table number of ADPCM conversion table of FIGS. 12-13 is initialized to 0 (step S702). In addition, the pointer I of the differential value is set to 0 (step S703).

Thereafter, the value of variable FORE_ERR is added to the contents of the 8-bit differential value DATA [I] referred to at present to produce a new differential value DATA [I] (step S704). In this case, variable FORE ERR is set to 0 as the initial value at step S701.

Figure 8:
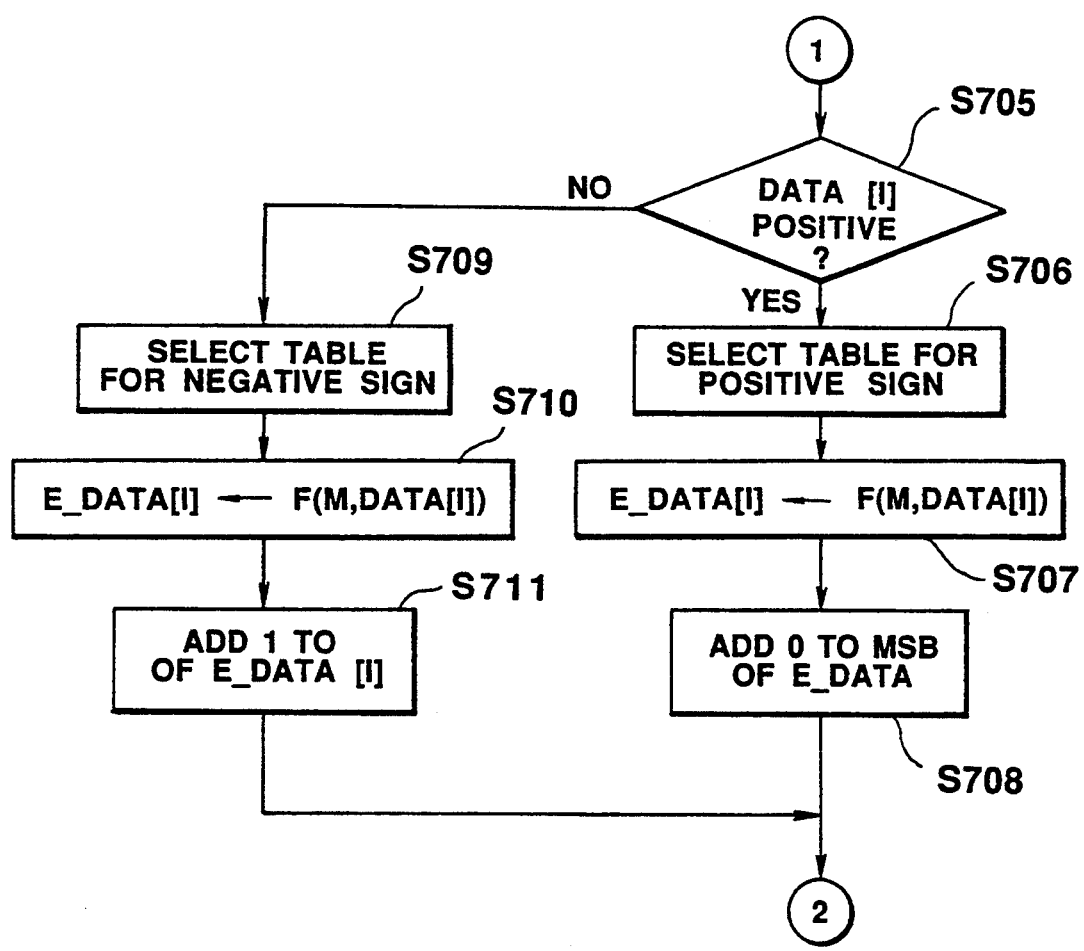
FIG. 8 is an operation flowchart (part 2) indicative of adaptive modulation.

It is determined depending on the MSB value of differential value DATA [I] which is 0 or 1 whether differential value DATA [I] is positive or negative (step S705 of FIG. 8).

If positive, an ADPCM conversion table for positive sign is selected as illustrated in FIG. 12 (step S706).

The adaptive quantized value is obtained using that conversion table as follows.

First, a table with a number pointed out at present by pointer M is selected. The M changes in conjunction with the respective tables for positive and negative signs. For example, if a #6 table for positive sign is selected, a #6 table for negative sign is also selected.

If a conversion table for positive sign is now selected, a 3-bit compressed version of an adaptive quantized value which takes one of 0-7 corresponding to the 8-bit differential value DATA [I] as a reference value is read from the #M table into array E_DATA [I] on RAM 8 (step S707).

More specifically, the current differential value is the first one, so that 0 is selected as the table number M. For example, if the differential value DATA [I] is 03H (H denotes a hexadecimal number), the uppermost adaptive quantized value of 3 corresponding to the differential value 03H on the #0 table of FIG. 12 is read out and substituted into E_DATA [I]. Array E_DATA [I] which stores the adaptive quantized value has a total of SIZE magnitudes with a data width of 4 bits and which are the same in number as array DATA [I] where I=0 to (SIZE −1).

Thereafter, the value of 0 indicative of a positive number is attached to the MSB of array E_DATA [I] of 4 bits (step S708).

If DATA [I] is negative, control passes to steps S705-S709 where a conversion table for negative sign illustrated in FIG. 13 is selected. Thereafter, as in the selection of the conversion table for positive sign, as mentioned above, a 3-bit compressed version of an adaptive quantized value which takes one of 0-7 corresponding to a received 8-bit differential value DATA [I] is read from a #M table into array E_DATA [I] (step S710).

Thereafter, a value of 1 indicative of a negative number is attached to the MSB of a 4-bit array E_DATA I] (step S711).

Thus, adaptive quantization of the differential values is terminated.

In order to prevent accumulation of conversion errors in the adaptive quantization, an operation will be described below where a differential value which is compressed to 4 bits by adaptive quantization and encoded is temporarily reproduced and the error between the reproduced value and the original differential value is fed to the next differential value.

Figure 9:
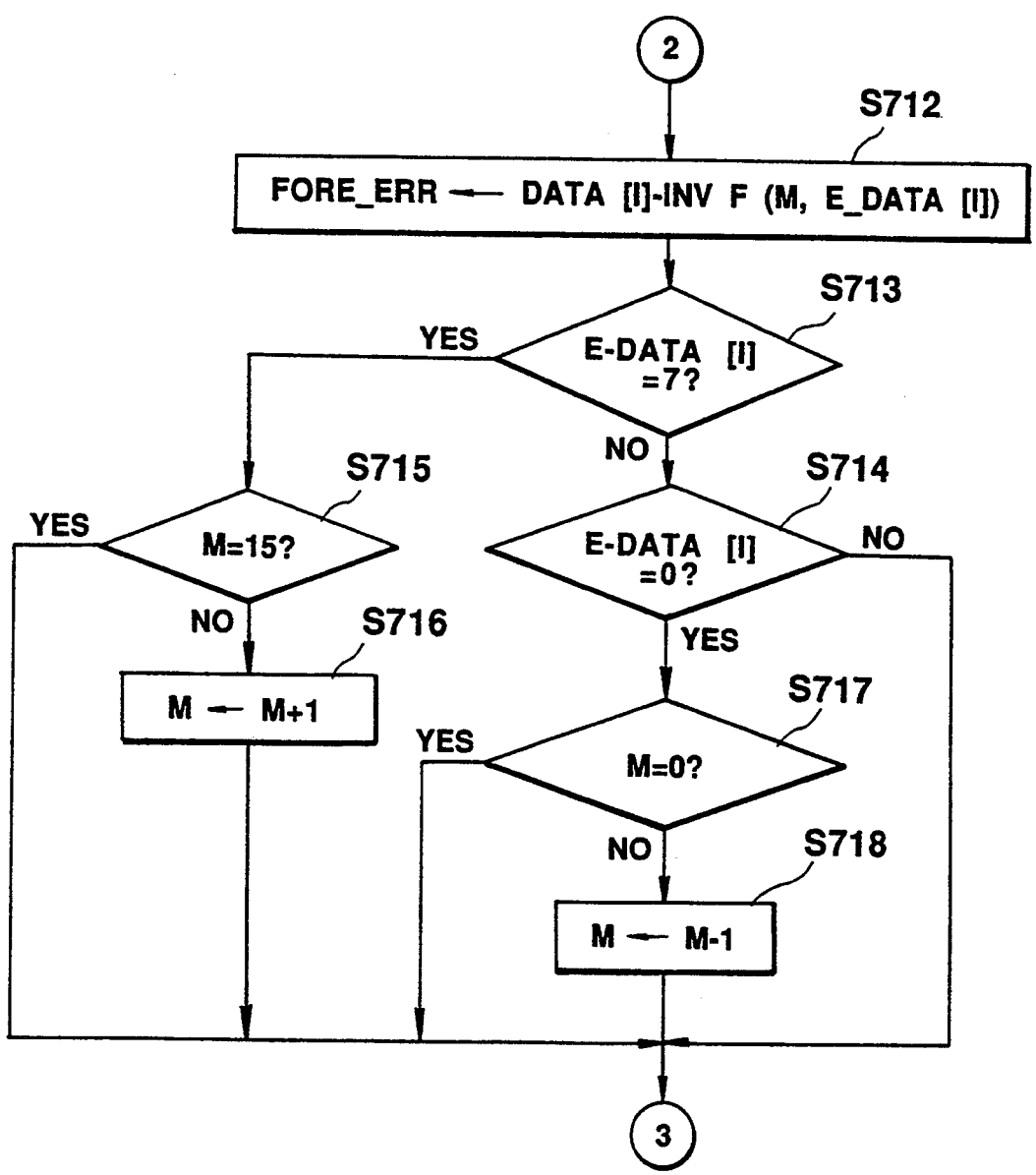
FIG. 9 is an operation flowchart (part 3) indicative of adaptive modulation.

First, at step S712 of FIG. 9, the #M conversion table selected at steps S706, S709 is used as it is and a differential value corresponding to adaptive quantized value E_DATA [I] is read out. For example, if an adaptive quantized value of 3 is obtained for E_DATA [I], as mentioned above, the table number "0" is already obvious. Therefore, conversely, a differential value of 03H for the original received values is obtained. In this case, since the differential value DATA [I] is 03H which coincides with a value on the table, no errors are produced in the differential value in the encoding and decoding operations. However, if a differential value DATA [I] such as 03H which is not on the table is encoded and decoded, an quantizing error will occur, of course.

Therefore, subtraction of a value read out reversely from the conversion table from the original 8-bit differential value is performed, as mentioned above, and the resulting error value is substituted into variable FORE_ERR (step S712).

This error is added to differential value DATA [I] at the timing of the next sampling clock (step S704) and the quantizing error is fed to the next cycle data. Therefore, the quantizing errors are not accumulated.

Figure 14:
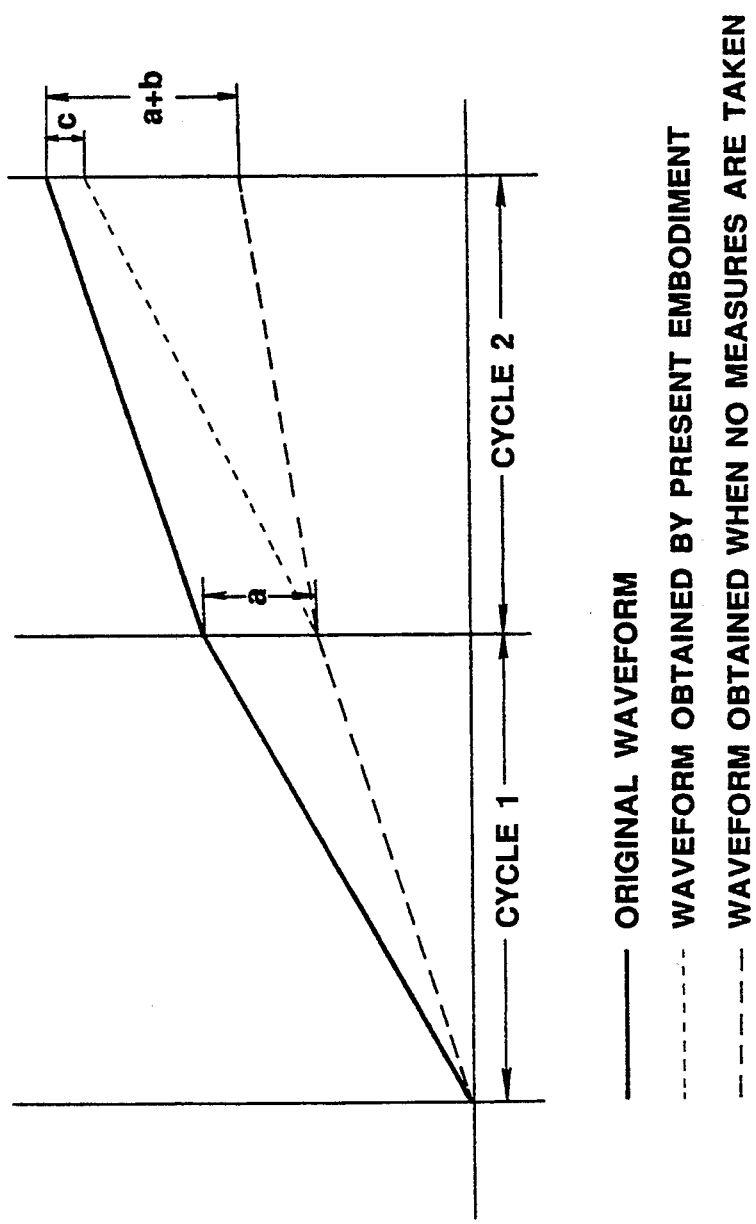
FIG. 14 illustrates a previously fed quantizing error fed to the next cycle data.

FIG. 14 illustrates a quantizing error fed to the next cycle data.

In FIG. 14, quantizing errors are produced at the end of a cycle 1 decoding operation in the following three cases; when a differential value for a received 16-bit signal is quantized with 10 bits, when the lower significant two bits of the quantized 10-bit differential value are cut off, and when the differential value in which the two bits are cut off is subjected to adaptive quantization. A deviation a from the original waveform (solid line) is produced due to a respective error produced in each of the three cases.

As control advances under such situation, an error b in cycle 2 is further accumulated at the end of cycle 2, so that a deviation becomes a+b. As time passes, this deviation further increases due to accumulation to thereby generate a so-called offset drift.

In the present embodiment, a deviation a occurs also at the end of cycle 1, but the error is fed to the next cycle 2, so that the error in cycle 1 is canceled in cycle 2. Thus, the original waveform is followed up. The deviation c at the end of cycle 2 includes the error in cycle 2 and the remainder of the error in cycle 1 not canceled.

However, this error is also fed to the next cycle, so that the errors are not accumulated as a whole and hence no offset drift of the waveform occurs.

The update of the conversion table of FIGS. 12 and 13 will be described below.

For example, in FIG. 12, when an adaptive quantized value P corresponding to differential value DATA [I] is read out using the #M table, that is, if, for example, a table with M=0 is referenced and a value "0AH" which cannot be expressed completely by the table as the received value (differential value) is received, the resulting adaptive quantized value P is a maximum value of 7.

As just described above, if either the maximum value of 7 or conversely the minimum value of 0 is selected, the table is inappropriate, so that a table which is one rank higher or lower must be selected.

The flow of steps S713-S718 of FIG. 9 is executed on the basis of the concept mentioned above.

First, it is determined at step S713 whether the adaptive quantized value is the maximum value of 7. If the determination is YES, it is then determined whether the table number M is the maximum value of 15 (step S715). If so, M cannot be updated to a larger number any longer, so that control passes to step S719 of FIG. 10. If the determination is NO, the table number M is incremented by one (step S716).

If the determination at step S713 is NO, it is then determined whether the adaptive quantized value is the minimum value of 0 (step S714). If the determination is NO, it is determined that the differential value to be subjected to adaptive quantization is between the maximum and minimum values on the current table and that the same table may also be used in the next cycle. Thus control passes to step S719.

If the determination at step S713 is YES, it is determined whether the table number M is the minimum value of 0 (step S717). If the determination is YES, M cannot be updated to a less number, so that control passes to the next step S719 of FIG. 10. If, conversely, the determination at step S713 is NO, the table number M is decremented by one in order to improve the accuracy of quantization (step S718).

Figure 10:
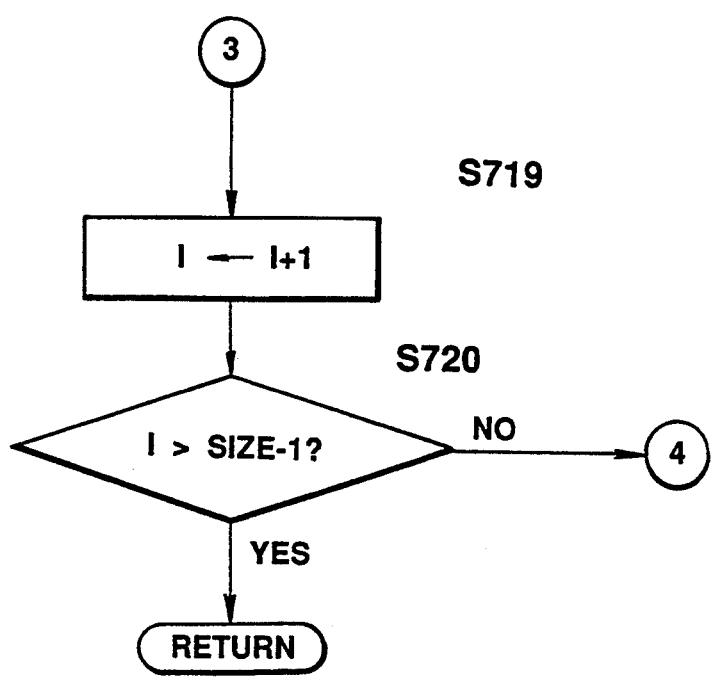
FIG. 10 is an operation flowchart (part 4) indicative of adaptive modulation.

Thereafter, the variable I is incremented (step S719 of FIG. 10). It is then determined whether the maximum value of variable I has exceeded the maximum of (SIZE—1) (step S720). If so, control returns to step S704 and the above processing is iterated. If not, the processing at step S304 of FIG. 3 is terminated.

In this way, the conversion tables are sequentially updated as required and a conversion table to be used next time is determined. In the case of voice data, the next differential value can be negative. In that case, the conversion tables of FIGS. 12 and 13 are exchanged. For example, assume now that the table number "7" is selected among the tables for positive signs. In that case, the same table number of 7 is selected even if a negative table is selected. This is because when voice data shifts from positive to negative, it exhibits substantially the same amplitude in most cases.

In this way, an adaptive quantized value with an accuracy of 4 bits is obtained for array E_DATA [I]. In this way, data which is subjected to adaptive quantization with an accuracy of 4 bits is written as a sound source signal into data RAM 4 of FIG. 2.

Generation of a tone signal from the tone source signal written into data RAM 4 in accordance with performer's playing at a keyboard of the FIG. 2 keyboard unit 10 for performing purposes will be described below.

This operation is substantially reverse to the encoding (modulating) operation described so far. The features are that a differential value Δy (FIG. 1(a)) which is subjected to adaptive quantization at each sampling period T is read out and sequentially accumulated at ¼ of the sampling period. That is, the operation is iterated where the differential value is read out once at every fourth accumulation. To this end, a variable of an interpolation counter IP is provided. Each time IP becomes 3, the differential value is read out. If IP is less than 3, the differential value is sequentially accumulated.

Figure 11:
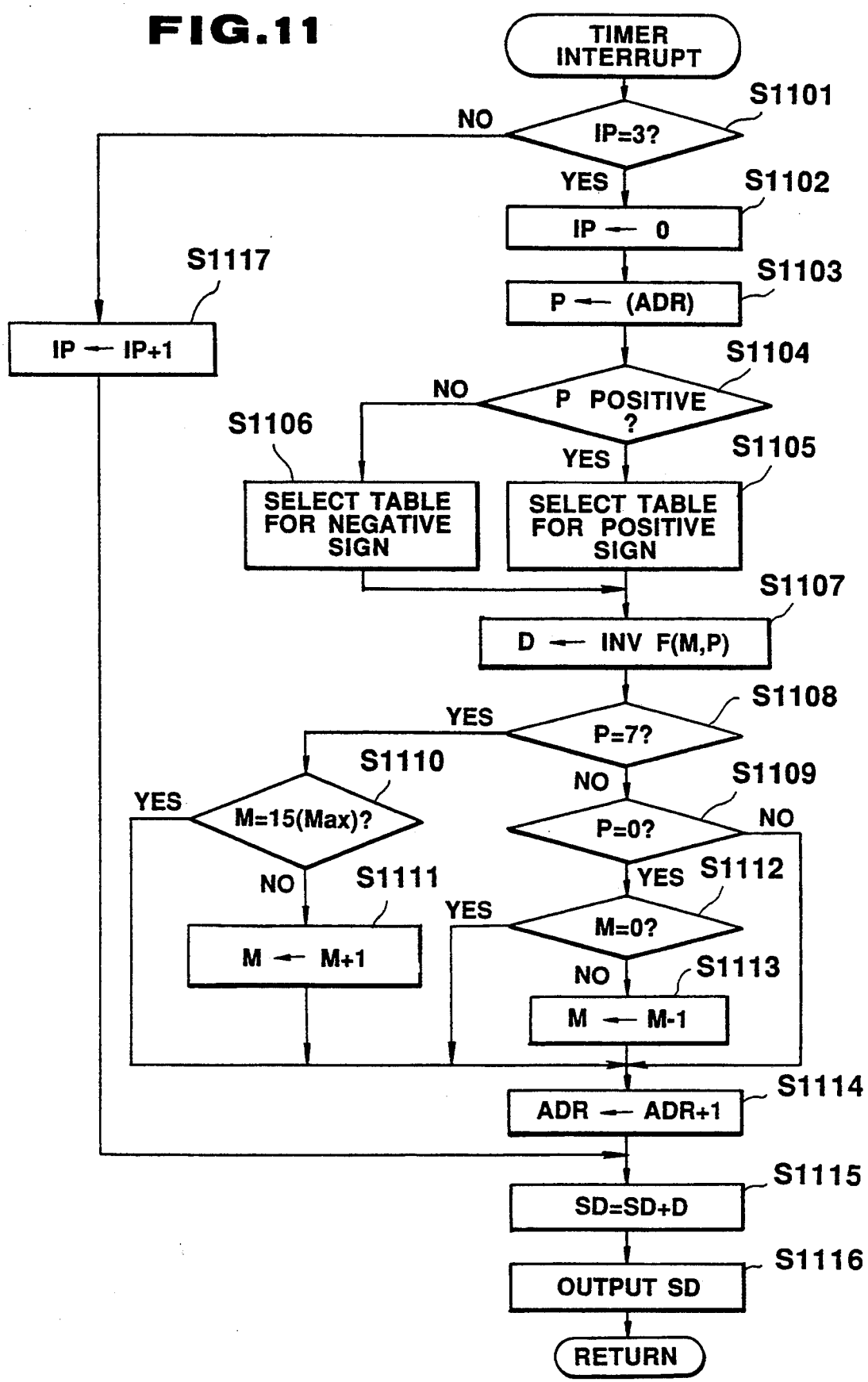
FIG. 11 is a flowchart indicative of data reproduction.

Reproduction will be described below using the operation flowchart of FIG. 11. The processing of FIG. 11 is realized by CPU 3 which executes an interrupt program in ROM 5 at each timing of ¼ of the sampling period T of FIG. 1 by timer interruption.

First, it is determined whether interpolation counter IP is 3 (step S1101). Since the value of interpolation counter IP is initialized to IP=3 in a main routine for tone generation, (not shown), the initial determination is YES and control passes to the next step.

Next, interpolation counter IP is reset (step S1102).

Thereafter, the adaptive quantized data according to the ADPCM system on data RAM 4 pointed out by address pointer ADR (corresponding to the contents of the above-mentioned array E_DATA [I]) is read out and the adaptive quantized value (corresponding to by of FIG. 1(a)) is substituted into variable P on RAM 8 (step S1103).

Since variable P has a positive or a negative sign, as described in FIG. 8, it is determined whether the sign bit (MSB) is positive or not (step S1104).

If P is positive, a conversion table for positive sign is selected as in the case of use of the sign illustrated in FIG. 12 (step S1105). If P is negative, a conversion table for negative sign as in the case of use of the sign illustrated in FIG. 13 is selected (step S1106) and the subsequent processing is performed.

Subsequently, a differential value corresponding to an adaptive quantized value P is read out with the current table number M and substituted into variable D (step S1107).

The next steps S1108–S1113 are exactly the same as steps S713–S718 of FIG. 9 for the updating of the table number. As just described above, since the table number is updated under exactly the same rules in encoding and decoding, exactly the same value is reproduced.

In order to read out the next differential value, the address pointer ADR is incremented (step S1114).

Thereafter, the value of variable D in which the current differential value (corresponding to Δy of FIG. 1(a)) corresponding to adaptive quantized value P exists is sequentially accumulated to variable SD (step S1115), and the value of variable SD is subjected to D/A conversion and output as a reproduced signal (step S1116).

This accumulation is performed four times in all. At a first time, after the determination at step S1101 becomes YES and the differential value is read out, as mentioned above, accumulation is performed. There is no interpolation counter any longer in the next and subsequent operations (see step S1102), so that the determination at step S1101 becomes NO and the interpolation counter is incremented at step S1117 while the same differential value D is accumulated on variable SD (step S1115).

In this way, accumulation is iterated until interpolation counter IP becomes 3. After all, the differential values are accumulated four times in all, inclusive of the case in which the initial IP=0. Every fourth accumulation, D/A conversion is performed at ¼ of the sampling period to thereby output a reproduced signal. After the four-time accumulation, the interpolation counter becomes 3, so that the next differential value is again read out and the above processing is iterated.

While in the above described embodiment the differential values which have been subjected to adaptive quantization are stored in memory, the present invention is not limited to this particular case, and is applicable to a system in which, for example, differential value data which is subjected to adaptive quantization is delivered to the receiving end through a transmission path.

In this case, signal transmission having an S/N (signal/noise) ratio greatly improved compared to the conventional techniques is realized using a transmission path having the same capacity as in the conventional techniques.

What is claimed is:
1. An electronic musical instrument comprising:
differential value quantizing means for sequentially quantizing differential values each between adjacent sampled values of a received sampled value signal, and for sequentially adding quantizing errors each produced when a differential value is quantized to corresponding first differential values to be next quantized sequentially;
lower significant bit separating means for sequentially separating respective groups of lower significant n bits of the first differential values quantized by said differential value quantizing means when the respective first differential values are quantized with n being a natural number equal to or larger than 2 to obtain corresponding second differential values, and for sequentially adding respective groups of separated n bits to corresponding first differential values to be next processed sequentially;

adaptive quantizing means for causing each of the obtained second differential values to be subjected to adaptive quantization to obtain an adaptive quantized value, and for adding a quantizing error produced in the adaptive quantization by decoding the adaptive quantized value to the corresponding second differential value to be next subjected to adaptive quantization;

storage means for storing the adaptive quantized value obtained by said adaptive quantizing means;

a performance operator for designating a pitch of a tone to be generated; and tone signal generating means for sequentially reading out adaptive quantized values stored in said storage means on the basis of a frequency corresponding to the pitch designated by said performance operator, for decoding the second differential values from the read-out adaptive quantized values, for sequentially accumulating the decoded second differential values by $2^n$ times at a period corresponding to $\frac{1}{2}^n$ of the sampling period of the received signal, and for outputting the resulting signal to generate a tone signal.

2. An electronic musical instrument comprising:

storage means for storing an adaptive quantized value obtained by the steps including a differential value quantizing step of sequentially quantizing differential values each between adjacent sampled values of a received sampled value signal, and sequentially adding quantizing errors each produced when a differential value is quantized to corresponding first differential values to be next quantized sequentially; a lower significant bit separating step of sequentially separating groups of lower significant n bits of the first differential values quantized by said differential value quantizing step when the respective first differential values are quantized with n being a natural number equal to or larger than 2 to obtain corresponding second differential values, and sequentially adding the respective groups of separated n bits to corresponding first differential values to be processed next; an adaptive quantizing step of causing each of the obtained second differential values to be subjected to adaptive quantization to obtain an adaptive quantized value, and adding a quantizing error produced in the adaptive quantization by decoding the adaptive quantized value to the corresponding second differential value to be next subjected to adaptive quantization;

a performance operator for designating a pitch of a tone to be generated; and tone signal generating means for sequentially reading out adaptive quantized values stored in said storage means on the basis of a frequency corresponding to the pitch designated by said performance operator, for decoding the second differential values from the read-out adaptive quantized values, for sequentially accumulating the decoded second differential values by $2^n$ times at a period corresponding to $\frac{1}{2}^n$ of the sampling period of the received signal, and for outputting the resulting signal to generate a tone signal.

* * * * *